(12) United States Patent
Izuha et al.

(10) Patent No.: US 7,250,235 B2
(45) Date of Patent: Jul. 31, 2007

(54) FOCUS MONITOR METHOD AND MASK

(75) Inventors: Kyoko Izuha, Yokohama (JP);
Masafumi Asano, Yokohama (JP);
Tadahito Fujisawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 561 days.

(21) Appl. No.: 10/784,277

(22) Filed: Feb. 24, 2004

(65) Prior Publication Data

US 2004/0224242 A1    Nov. 11, 2004

(30) Foreign Application Priority Data

Feb. 24, 2003    (JP)    ............... 2003-046236

(51) Int. Cl.
*G03F 9/00*    (2006.01)
*G03C 5/00*    (2006.01)

(52) U.S. Cl. ................ 430/5; 430/30; 430/311; 355/52; 355/55

(58) Field of Classification Search ............ 430/5, 430/30, 311; 355/52, 55
See application file for complete search history.

(56) References Cited

U.S. PATENT DOCUMENTS

| 6,440,616 | B1 |   | 8/2002 | Izuha et al. |  |
|---|---|---|---|---|---|
| 6,674,511 | B2 | * | 1/2004 | Nomura et al. | 355/55 |
| 6,701,512 | B2 | * | 3/2004 | Sutani et al. | 716/21 |
| 6,764,794 | B2 | * | 7/2004 | Nakao et al. | 430/5 |
| 6,777,145 | B2 | * | 8/2004 | Zhou et al. | 430/30 |
| 6,797,443 | B2 | * | 9/2004 | Nakao et al. | 430/30 |
| 6,811,939 | B2 | * | 11/2004 | Nakao et al. | 430/30 |
| 6,890,692 | B2 | * | 5/2005 | Nakao et al. | 430/30 |
| 6,974,653 | B2 | * | 12/2005 | Leung et al. | 430/30 |
| 7,108,945 | B2 | * | 9/2006 | Sutani et al. | 430/5 |

FOREIGN PATENT DOCUMENTS

JP    2001-100392    4/2001

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

A focus monitor method comprising preparing a mask comprising a first and second focus monitor patterns and an exposure monitor pattern, the focus monitor patterns being used to form first and second focus monitor marks on a wafer, and the exposure monitor pattern being used to form exposure meters on the wafer, obtaining a exposure dependency of a relationship between a dimensions of the focus monitor marks and the defocus amount, forming the focus monitor marks and exposure monitor mark on the wafer, measuring a dimension of the exposure monitor mark to obtain an effective exposure, selecting a relationship between the dimensions of the focus monitor marks and the defocus amount corresponding to the effective exposure, measuring a dimensions of the first and second focus monitor marks, and obtaining a defocus amount in accordance with the measured dimensions of the focus monitor marks and the selected relationship.

24 Claims, 7 Drawing Sheets

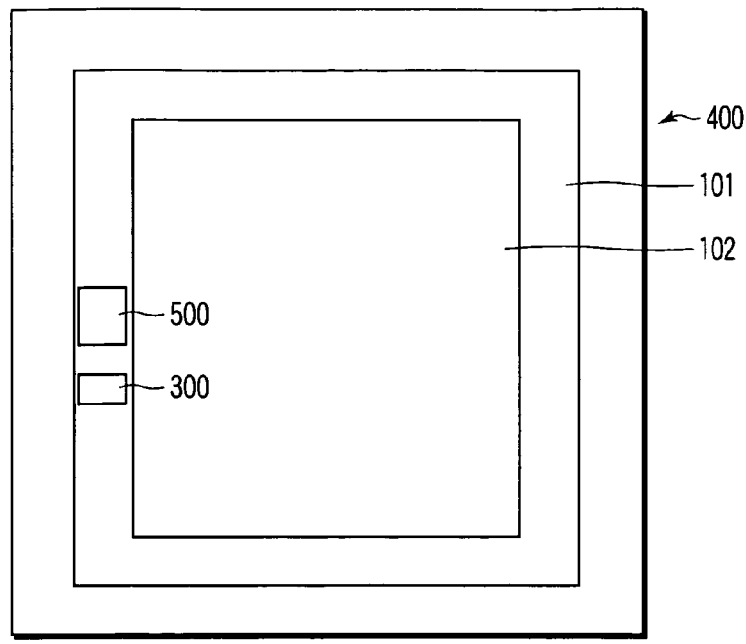
FIG. 12A
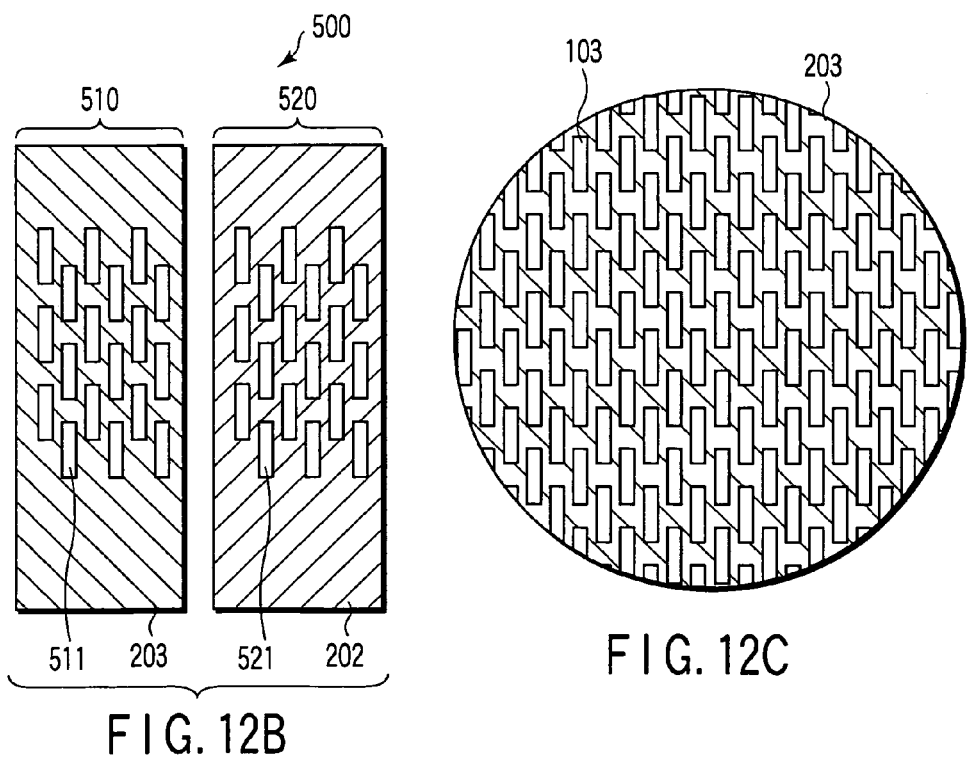
FIG. 12B
FIG. 12C

FOCUS MONITOR METHOD AND MASK

CROSS-REFERENCE TO RELATED APPLICATIONS

This application is based upon and claims the benefit of priority from prior Japanese Patent Application No. 2003-046236, filed Feb. 24, 2003, the entire contents of which are incorporated herein by reference.

BACKGROUND OF THE INVENTION

1. Field of the Invention

The invention relates to a focus monitor method and mask suitable to setting focus conditions in a projection exposure apparatus relevant to the manufacture of semiconductor devices and LCD devices and the like.

2. Description of the Related Art

Among techniques of measuring a defocus amount with high accuracy and simplicity, a method as described hereinafter is known (for example, as disclosed in Japanese Unexamined Patent Application Publication No. 2001-100392). According to this technique, a focus monitor mask in which a pattern (focus monitor pattern) capable of detecting focus variations is disposed, a line width of a post-transfer monitor mark is measured by using a linewidth measuring apparatus (optical linewidth measuring apparatus, such as an SEM or the like) or a linewidth measuring functionality built in an exposure apparatus itself, a variation amount of focus is obtained thereby.

According to the focus monitor pattern described in the above patent publication, the defocus amount independently from exposure can be measured even when the exposure. However, depending on a set exposure, a sensitivity of calibration curve can undesirably varied due to the exposure. The set exposure is set by a layer of a device. However, when a large difference takes place between set exposures for layers, there can occur a case in which the large deviation from an optimal exposure for the focus monitor pattern (the exposure range in which exposure dependency is law in the calibration curve). To address such a problem, it is ideal to optimally design the focus monitor pattern by the layer. However, the creation of the pattern is a time-and-cost consuming process, so that a more simple technique has been demanded.

As described above, the technique gives rise to the problem in that when exposure is performed with the exposure largely deviating from the optimal exposure for the focus monitor pattern, the exposure dependency takes place in the calibration curve, resulting in a large tolerance of the amount of the defocus to be obtained.

BRIEF SUMMARY OF THE INVENTION

According to one aspect of the present invention, there is provided a focus monitor method comprising: preparing a mask comprising a first and second focus monitor patterns and an exposure monitor pattern, the first and second focus monitor patterns being used to form first and second focus monitor marks having dimensions variable depending on a defocus amount on a wafer, a defocus amount dependency of dimension of the first focus monitor mark being different form a defocus amount dependency of dimension of the second focus monitor mark, and the exposure monitor pattern being used to form exposure meters having dimensions variable depending on an effective exposure on the wafer; obtaining a exposure dependency of a relationships between a dimensions of the first and second focus monitor marks and the defocus amount; forming the first and second focus monitor marks and exposure monitor marks on the wafer by using the mask; measuring a dimension of the exposure monitor marks to obtain an effective exposure; selecting a relationship between the dimensions of the first and second focus monitor marks and the defocus amount corresponding to the effective exposure in accordance with the obtained effective exposure and the exposure dependency of the relationships between the dimension of the first and second focus monitor marks and the defocus amount; measuring a dimension of the first and second focus monitor marks; and obtaining a defocus amount in accordance with the measured dimensions of the first and second focus monitor marks and the relationship between the dimension of the first and second focus monitor marks and the defocus amount corresponding to the effective exposure.

According to one aspect of the present invention, there is provided a focus monitor method comprising: preparing a first mask comprising a first and second focus monitor patterns, the first and second focus monitor patterns being used to form first and second focus monitor marks having dimensions variable depending on a defocus amount are formed on a wafer, a defocus amount dependency of dimension of the first focus monitor mark being different form a defocus amount dependency of dimension of the second focus monitor mark; forming the first and second focus monitor marks on the wafer with a plurality of exposures; obtaining a first relationships between a dimension of the first and second focus monitor marks and a defocus amount for each of a plurality of exposure dose; obtaining a nonuniformity amount of the first relationships due to a variation in the exposure; obtaining a second relationship between the first relationships and the exposure when the obtained nonuniformity amount is greater than a predetermined value; preparing a second mask comprising third and fourth focus monitor patterns and an exposure monitor pattern, the third and fourth focus monitor pattern being used to form third and fourth focus monitor marks having dimensions variable depending on a defocus amount are formed on the wafer, a defocus amount dependency of dimension of the first focus monitor mark being different form a defocus amount dependency of dimension of the second focus monitor mark, and the exposure monitor pattern being used to form exposure meter having dimensions variable depending on an effective exposure on the wafer; obtaining a third relationship between the dimension of an exposure meter and the exposure; forming the third and fourth focus monitor marks and the exposure meters on the wafer by using the second mask; measuring the dimension of the exposure meter; obtaining an effective exposure from the measured dimension of the exposure meter and the third relationship; selecting a fourth relationship between the dimension of the third and fourth focus monitor marks and the defocus amount corresponding to the effective exposure from the obtained effective exposure and the second relationship; measuring the dimension of the third and fourth focus monitor marks; and obtaining a defocus amount in accordance with the measured dimension of the third and fourth focus monitor marks and the fourth relationship.

According to one aspect of the present invention, there is provided a mask comprising: a device region wherein a device pattern is formed; a first pattern region having at least one first monitor pattern which is constituted by a first opening surrounded by a shielding portion or constituted by the shielding portion surrounded by the first opening; a second pattern region having at least one second monitor pattern which is constituted by a second opening surrounded by a translucent film or constituted by the translucent film surrounded by the second opening, and is capable of giving a phase difference to an exposure light passing through the translucent film relative to an exposure light passing through the second opening; and a third pattern region including a plurality of blocks intermittently or continuously arranged in one direction each including a shield portion and transmission portion arranged in a constant width p incapable of being resolved in a projection exposure apparatus in the direction and having a monotonously changing dimension ratio of the shield portion to the transmission portion of the block in the direction, wherein one of the first pattern region and the second pattern region is formed at least in the device region.

According to one aspect of the present invention, there is provided a mask comprising: a device region wherein a device pattern is formed; a device region wherein a device pattern is formed; a first pattern region comprises at least one first monitor pattern which is constituted by a first translucent film surrounded by a first opening portion or constituted by the first opening portion surrounded by the first translucent film, and is capable of giving a first phase difference to an exposure light passing through the first translucent film relative to an exposure light passing through the first opening; a second pattern region comprises at least one second monitor pattern which constituted by a second translucent film surrounded by a second opening portion or constituted by the second opening portion surrounded by the second translucent film, and is capable of giving a second phase difference different from the first phase difference to an exposure light passing through the second translucent film relative to an exposure light passing through the second opening; and a third pattern region including a plurality of blocks intermittently or continuously arranged in one direction each including a shield portion and transmission portion arranged in a constant width p incapable of being resolved in a projection exposure apparatus in the direction and having a monotonously changing dimension ratio of the shield portion to the transmission portion of the block in the direction, wherein one of the first pattern region and the second pattern region is formed at least in the device region.

BRIEF DESCRIPTION OF THE SEVERAL VIEWS OF THE DRAWING

FIGS. 12A to 12C are plan views showing the structure of a modified example of a mask.

DETAILED DESCRIPTION OF THE INVENTION

Embodiments according to the invention will be described hereinafter with reference to the drawings.

Figure 1:
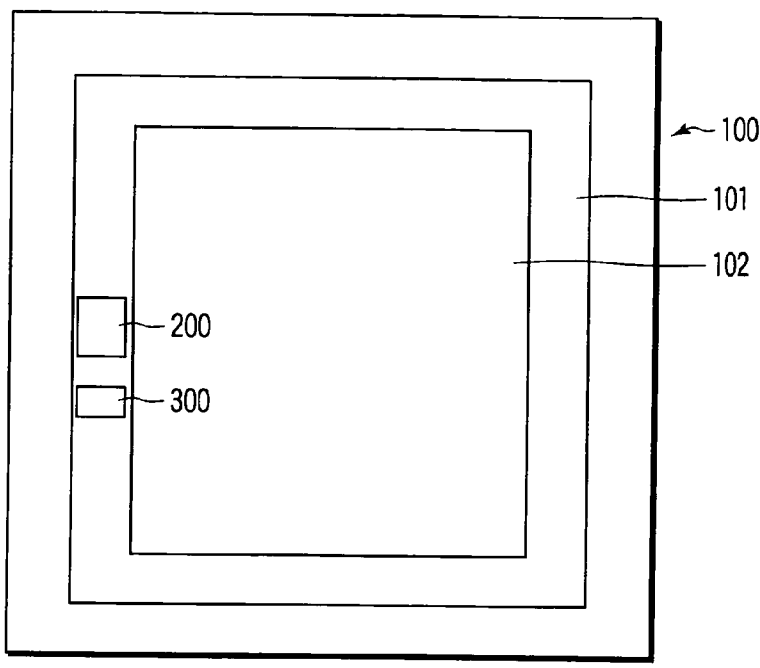
FIG. 1 is a plan view schematically showing the structure of a mask according to an embodiment of the invention.

FIG. 1 is a plan view schematically showing the structure of a mask according to an embodiment of the invention. Referring to FIG. 1, in a mask 100, a focus monitor pattern 200 and an exposure monitor pattern 300 for measurement of an effective exposure are disposed close to each other. The focus monitor pattern 200 and the exposure monitor pattern 300 are formed in a dicing line 101 around a device region 102 where device patterns are formed.

Figure 2A:
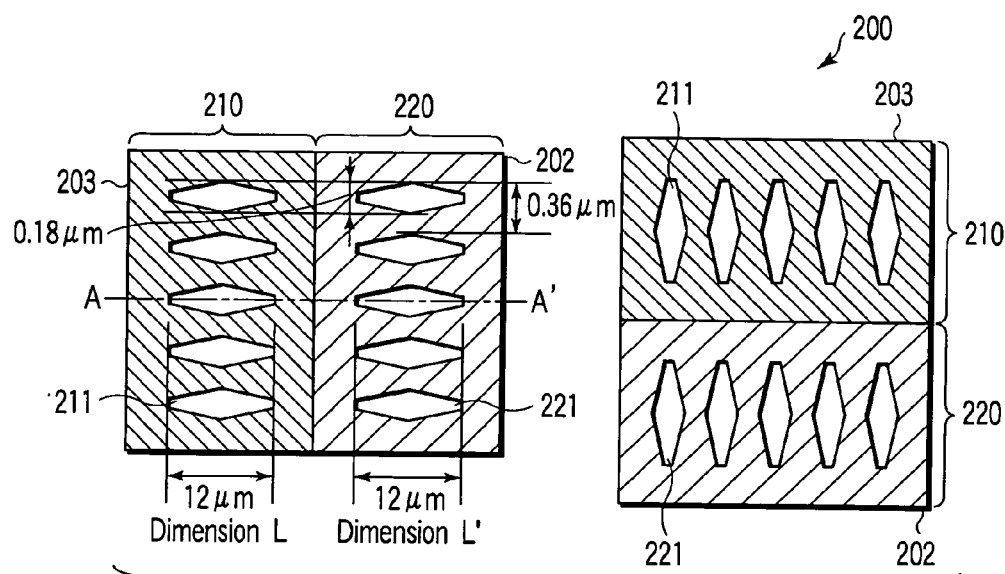
FIG. 2A is a plan view showing a focus monitor.
Figure 2B:
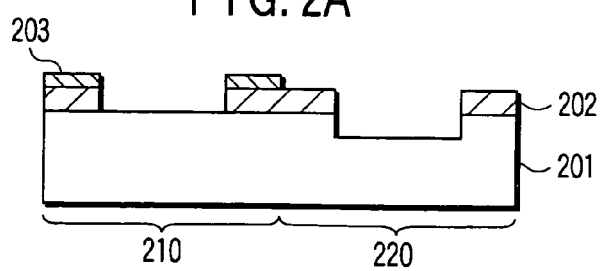
FIG. 2B is a cross sectional view along with the line A-A' showing FIG. 2A.

The structure of the focus monitor pattern will be described by using FIGS. 2A and 2B. FIG. 2A is a plan view showing the structure of the focus monitor pattern, and FIG. 2B is a cross-sectional view of the A-A' section of FIG. 2A. In the drawings, numeral 201 denotes a transparent substrate of glass or the like, numeral 202 denotes a translucent film of $SiO_2$ or the like, and numeral 203 denotes a light shield film of Cr or the like. Rhombic marks 211 (first opening portions) each surrounded by the light shield film 203 are formed in a first pattern region 210. Rhombic marks 221 (second opening portion) each surrounded by the translucent film 202 are formed in a second pattern region 220. The translucent film 202 has a transmittance of 6% for exposure light and has the effect of shifting the phase thereof by 180 degrees.

Thus, the rhombic marks 211 are formed in the first pattern region 210, and the rhombic marks 221 are formed in the second pattern region 220. More specifically, five rhombic marks 211 and five rhombic marks 221 are formed, respectively, at a constant pitch in the regions 211 and 220. As shown in the plan views of FIGS. 2A and 2B, the rhombic marks 211 and 221 are each formed such that, in terms of the wafer, the length thereof along the x-axis is 12 µm, the length along the Y-axis is 0.18 µm, and the pitch therebetween is 0.36 µm. The substrate in the portion having the rhombic marks 221, that is, the second opening portions is concavely formed to a depth of, for example, 124 nm so that the phase difference of 90 degrees imparted between exposure light passing through the translucent film 202 and exposure light passing through the opening 221. An appropriate exposure for the focus monitor pattern is 7.5 mJ/cm².

Figure 3:
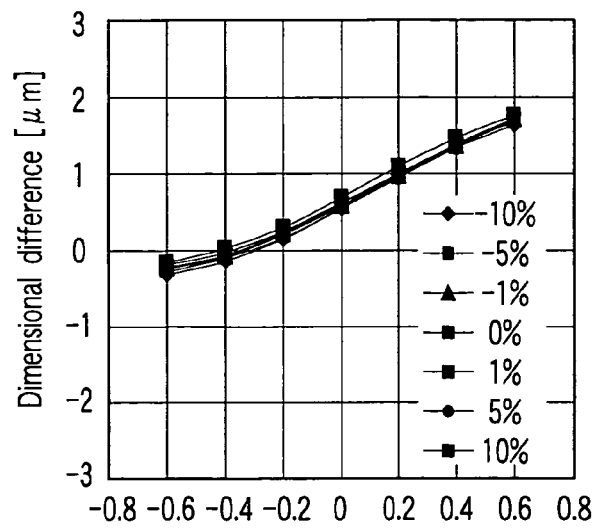
FIG. 3 shows exposure dependency of the relationship between a dimensional difference in the longitudinal dimension of rhombic mark 211, 221 and the defocus amount.

FIG. 3 shows exposure dependency of the relationship between a dimensional difference in longitudinal dimensions of focus monitor marks, which are formed by transfer of the rhombic marks 211 and 221, and the defocus amount. More specifically, shown in FIG. 3 is the relationship between the dimensional difference and the defocus amount in the case where the exposure was varied by ±1%, ±5%, and ±10% from the value of 7.5 mJ/cm² set as the center value. As is shown in FIG. 3, it can be verified that even when the exposure is caused variable in the range of ±10%, the exposure does not substantially vary. Consequently, even when the exposure has been fluctuated by 7.5 mJ/cm², the defocus amount can be measured with high accuracy.

In the structure shown in FIG. 2A, focus monitor patterns of two types different in the array direction are formed. When a large aberration occurs with an optical system of the exposure apparatus, there can occur a case where marks are formed in different sizes depending on the array direction of the patterns. In this case, an average of amounts of defocus obtained through the individual focus monitor marks is used as a defocus amount for measurement. This manner consequently enables the influence of the optical-device aberration can be restrained.

Figure 4:
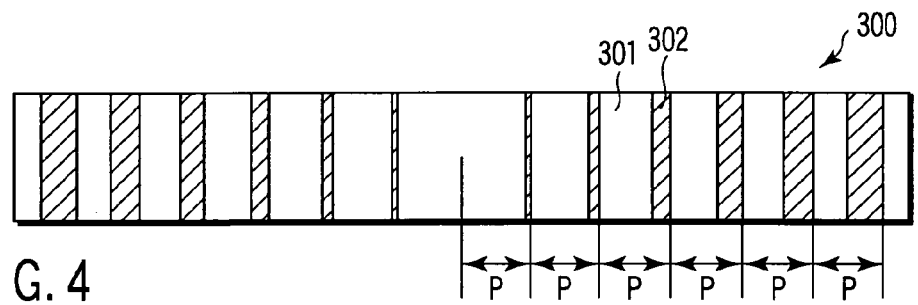
FIG. 4 is a plan view showing the structure of an exposure monitor pattern.

The structure of the exposure monitor pattern will now be described hereinbelow by using FIG. 4. FIG. 4 is a plan view showing the structure of the exposure monitor pattern.

As shown in FIG. 4, in the exposure monitor pattern 300, transmissive portions 301 and shield portions 302 are individually arrayed in blocks each having a width p, which are unresolvable with the exposure apparatus. A plurality of blocks are successively arrayed in the array direction of the transmissive portions 301 and the shield portions 302. In the array direction, a duty ratio between the transmissive portion 301 and the shield portion 302 monotonically varies. The plurality of blocks may be intermittently arrayed.

Upon irradiation of the exposure monitor pattern with illumination light, the optical intensity distribution of diffractive light through the exposure monitor pattern over the substrate surface exhibits a monolithic reduction or a monolithic increase that does not depend on the focus position.

A case is now assumed where a mask desired to be used to monitor an effective exposure is set in an exposure apparatus with a number of openings NA, a coherent factor σ, and a wavelength λ. In this case, according to diffraction theory, the conditions of the width p (wafer-based dimension) of the block unresolvable with the apparatus $$1/P \geq (1+\sigma)NA/\lambda$$

Figure 5:
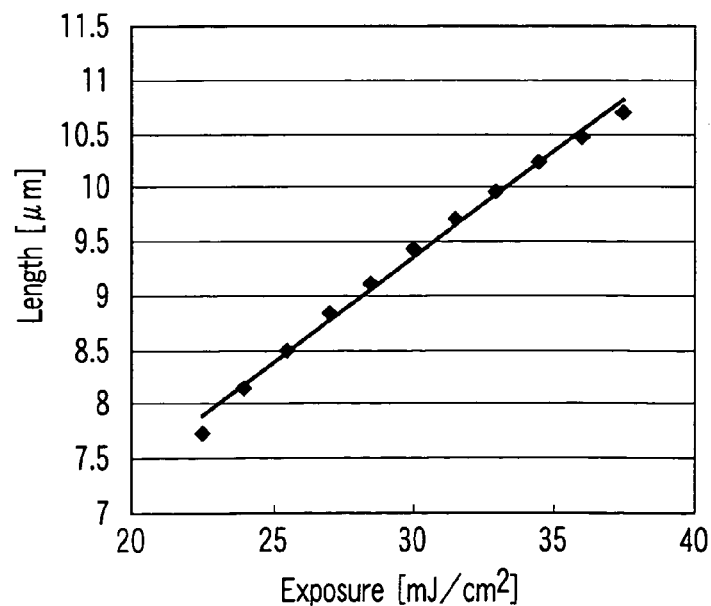
FIG. 5 is a view showing the relationship between the length of each exposure meter and the exposure.

With a photoresist film having been formed over the substrate, latent images (exposure meters) corresponding to gradient distributions of the exposure independent of the focus condition are formed over the photoresist film. The exposure is measured by measuring the length on one side of a pattern obtained through development of the latent image, which has been formed on the photoresist film, or development of the photoresist film. FIG. 5 shows the relationship between the length of each of the exposure meters and the exposure.

The dimensions of measured focus monitor mark, the defocus amount thereof, and the exposure can be expressed by the following equation:

$$L = \sum_{n=0} a_n E_n * F + \sum_{n=0} a'_n = 0^{E^n}$$

where, L is a dimensional difference between the longitudinal dimensions of the mark in the first pattern region 210 and the mark in the second pattern region 220; F is a defocus amount; E is an exposure; a is a coefficient; and n is an integer phase difference.

Accordingly, when the dimensions of focus monitor patterns to be measured are fluctuated due to the exposure, the calibration curve is first eliminated by using the effective exposure acquired from the exposure meter, and exposure dependency of the calculated defocus amount can then be eliminated.

Figure 6:
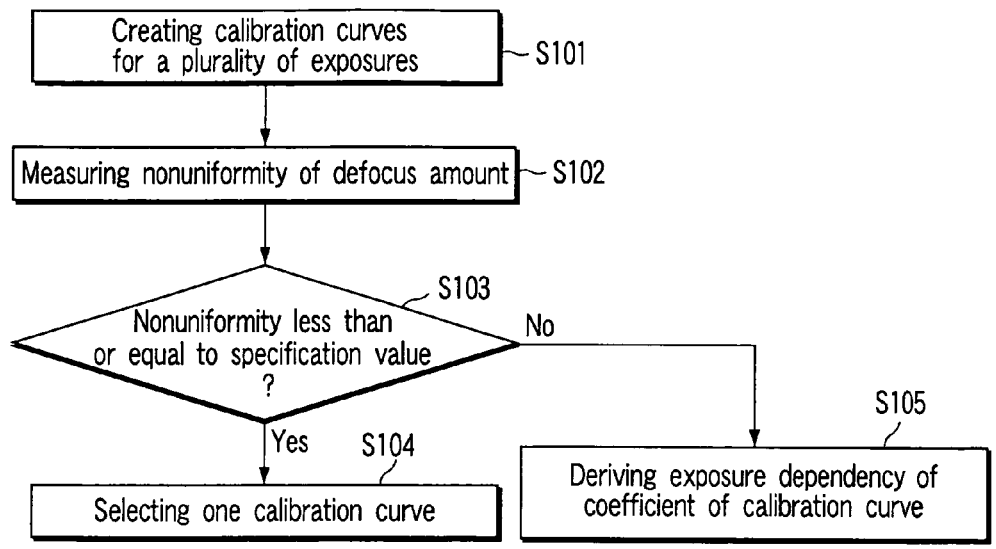
FIG. 6 is a flowchart showing a part of a defocus-amount measuring method of an embodiment according to the invention.

First, a determination is made whether a correction of a calibration curve (the relationship between the dimensional difference and the defocus amount) corresponding to the effective exposure is necessary for a set exposure. As a result, if the correction of the calibration curve is determined necessary, the relationship between the effective exposure and the calibration curve should be obtained. A method for the above will be described with reference to FIG. 6. FIG. 6 is a flowchart showing a part of a defocus-amount measuring method of an embodiment according to the invention.

The method performs exposure for patterns formed over the mask by applying a plurality of exposures and then investigate the exposure dependency of a calibration curve (step S101).

Figure 7:
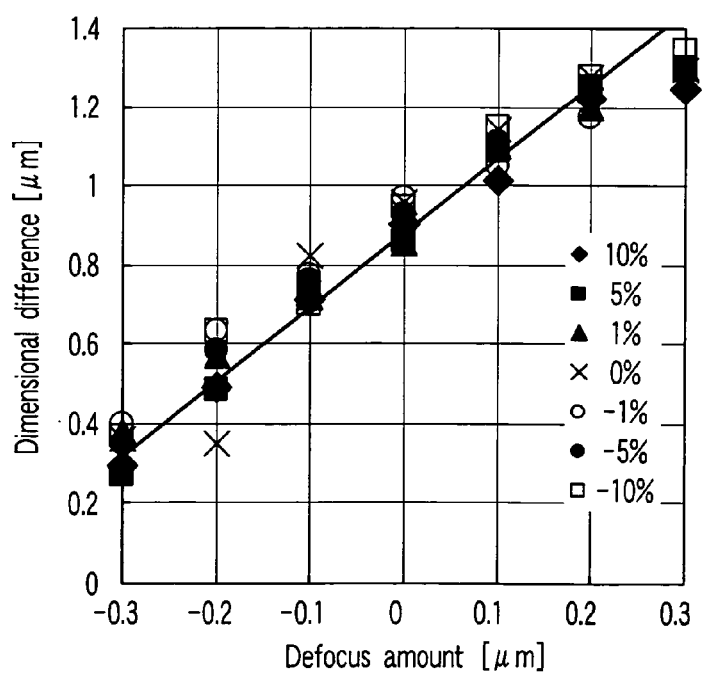
FIG. 7 is a diagram showing exposure dependency of the relationship (calibration curve) between the dimensional difference and the defocus amount.

In practice, exposure was performed with the exposure varied in the range of −10% to +10% from the central value set to 30 mJ/cm². FIG. 7 is a graph showing the exposure dependency of the relationship between the dimensional difference and defocus (calibration curve). More specifically, the graph shows the relationship between the dimensional difference and the defocus amount in the event that the exposure was varied at ratios of −10%, −5%, −1%, 0% (30 mJ/cm²), +1%, +5%, +10% from 30 mJ/cm² set as the central value. The results shown in FIG. 7 teaches that the calibration curve is variable depending on the set exposures (straight portions in the graph is variable).

Conditions for obtaining the calibration curve are shown below. On a wafer, there are formed a coating-type reflection preventive film having a thickness of 60 nm and a 0.4 μm thick photoresist film of a chemical amplification positive type. The reflection preventive film and the photoresist film are formed by using a spin coating process.

The specifications of an exposure apparatus used are inclusive of: reduction ratio of an exposure apparatus=¼; exposure light wavelength=248 nm; NA=0.6; coherence factor σ=0.75; and ring zone shielding factor ε=0.67. Exposure monitor patterns used with this exposure apparatus are characterized as: pitch=0.19 μm; width=2 μm; and space size (in terms of the wafer)=continually varied by 0.625 nm.

Subsequently, the wafer after completion of the exposure underwent post exposure baking (PEB) at 100° C. for 90 minutes, followed by imagewise development for 60 seconds using an alkaline developing solution of 0.21N.

Subsequently, the dimension of these the two types of wedge-shaped patterns formed over the wafer processed as described above was dimensionally measured by using an optical linewidth measuring apparatus to obtain a difference between a pattern dimension L' and a pattern dimension L. The pattern dimension L' represents the x-axis directional dimension of the wedge-shaped pattern formed by the transfer of the mark in the second pattern region 220. The pattern dimension L represents the x-axis directional dimension of the wedge-shaped pattern formed by the transfer of the mark in the first pattern region 210. From a monolithic increase in the characteristics of the dimensional difference with respect to the defocus, the magnitude of positional deviation of focus can be obtained together with the sign.

Subsequently, after having obtained exposure dependency of the calibration curve, the method measures the nonuniformity in the defocus amount due to exposure nonuniformity (step S102). As is shown in FIG. 7, the primary expression "y=ax+b" is used to approximate the calibration curve at the each individual exposure. Thereby, the method obtains the nonuniformity in a y-axis intercept ("b") of each individual approximation expression. In the present example case, the nonuniformity is obtained with maximum value derived from the expression "maximum $b_{max}$−minimum value $b_{min}$." The nonuniformity in the y-axis intercept is divided by a tilt a. A resultant value thus obtained represents the nonuniformity in the defocus amount caused by exposure nonuniformity.

The method is then determines whether the nonuniformity thus obtained is less than or equal to a specification value (step S103). In the present embodiment, the specification value is 10 nm. In the case represented by the calibration curve shown in FIG. 7, the nonuniformity was 50 nm.

If the nonuniformity is less than or equal to the specification value (as in the case shown in FIG. 3), the method determines one of the calibration curves, which having been obtained as described above, to be the calibration curve at the corresponding exposure (step S104).

Figure 8:
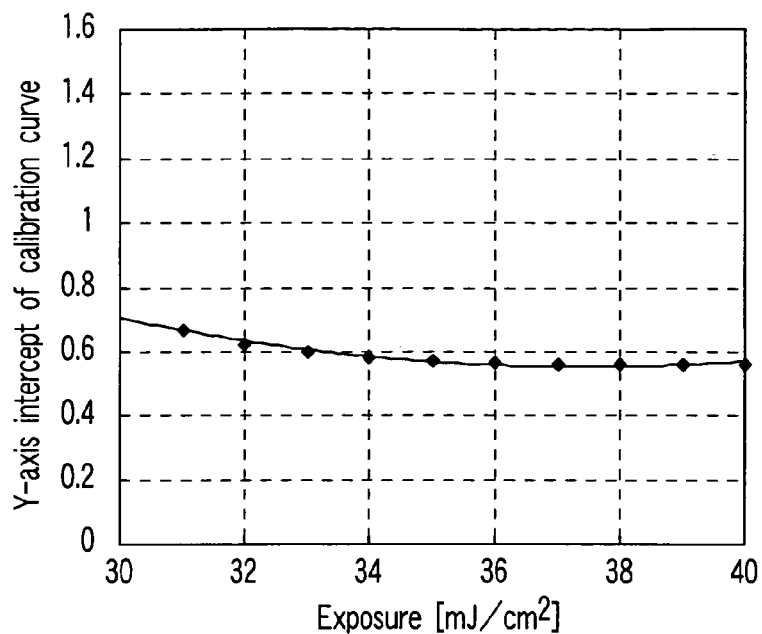
FIG. 8 is a coefficient b with respect to the exposure.

If the nonuniformity is greater than the specification value, the method obtains the relationship between the calibration curve and the exposure (step S105). In the present case, the method obtains exposure dependencies of coefficients b obtained in the earlier step. The coefficients b with respect to the exposures are shown in FIG. 8. The coefficient b is approximated by a quadratic function. In the case of FIG. 8, the quadratic function is "0.0029 $x^2$−0.2081 x+4.4479."

In the manner described above, the method obtains data on the necessity of the calibration curve correction and the relationships between the effective exposures and the calibration curves.

Figure 9:
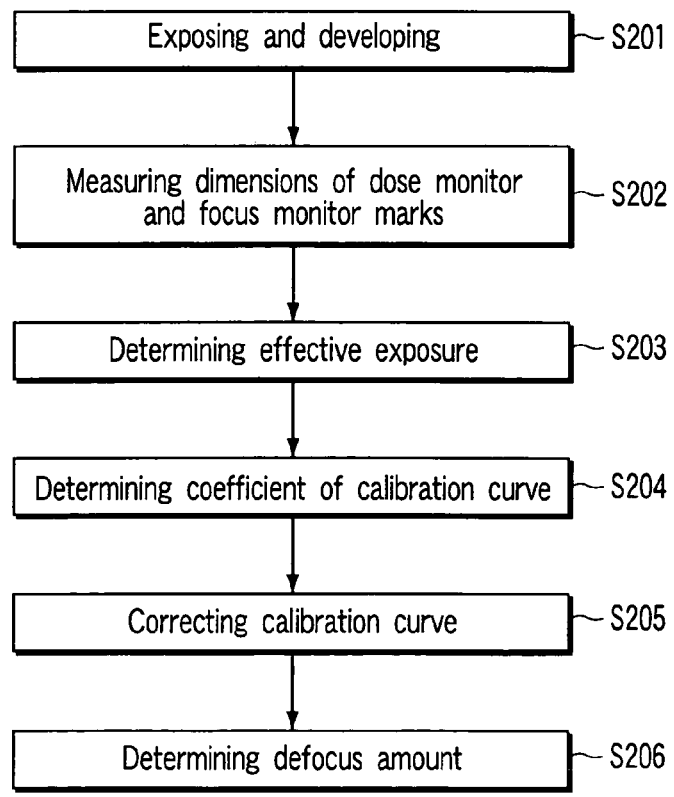
FIG. 9 is a flowchart of the defocus-amount measuring method of an embodiment according to the invention.

Referring now to FIG. 9, a description will be made hereinbelow regarding the defocus-amount measuring method in the case where the nonuniformity is greater than the specification value, wherein is risen the necessity of correction of the calibration curve in accordance with the effective exposure. FIG. 9 is a flowchart of the defocus-amount measuring method of an embodiment according to the invention.

A practical wafer is exposed using the mask described above, and focus monitor marks, and exposure meters are thereby formed (step S201). Exposure and development conditions are the same as those described above.

Subsequently, the dimensions of focus monitor marks of the two types and the exposure meter are measured (step S202). The dimensional difference between the focus monitor marks of the two types are obtained. An effective exposure is obtained from the dimension of the exposure meter (step S203).

Calculation is performed by assigning the obtained effective exposure to the above-described x function to thereby obtain the coefficient (step S204). Then, the calibration curve is shifted parallel to the y direction so that the intercept of the calibration curve become equal to the calculated coefficient to thereby correct the calibration curve (step S205). Although the plurality of calibration curves are present in the case shown in FIG. 7, a calibration curve when the exposure is set to 30 mJ/cm$^2$ is shifted in the present example.

Subsequently, the method obtains the defocus amount by using the dimensional difference between the focus monitor marks and concurrently using the corrected calibration curve (step S206).

Figure 10:
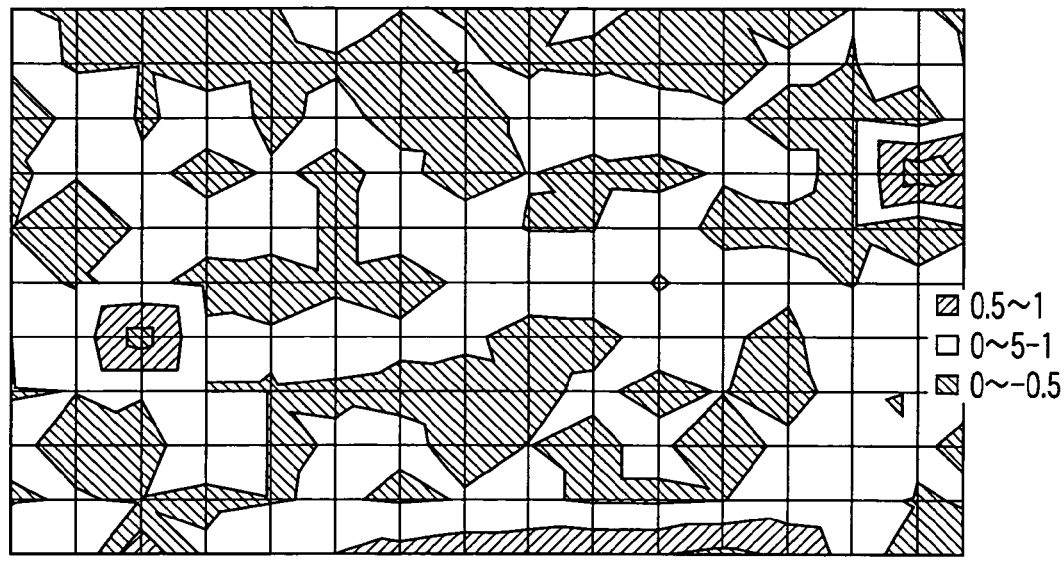
FIG. 10 is a plan view showing focus nonuniformity in a wafer plane, obtained as a result of application of the embodiment method.
Figure 11:
FIG. 11 is a plan view showing focus nonuniformity in a wafer plane, obtained as a result of a conventional method.

FIG. 10 shows focus nonuniformity in a plane of the wafer, obtained by applying the inventive method. FIG. 11 is a plan view showing focus nonuniformity in a plane of a wafer, obtained by applying the conventional method. The conventional method exhibited systematic distribution, which is considered to have been caused by exposure offsets. As shown in FIG. 10, the embodiment method is designed capable eliminating systematic error considered to have been caused by exposure variations.

According to the embodiment method, the focus monitor pattern and the exposure monitor pattern are formed in the mask, the effective exposure is measured from the dimension of the exposure meter formed in the resist, and the calibration curve is corrected in accordance with the measured effective exposure. Consequently, error in the defocus amount can be reduced even with a set exposure greatly differing from the optimal amount of exposure.

In the present embodiment method, while the focus detection marks are measured using an optical linewidth measuring apparatus disposed independently from the exposure apparatus. However, the marks can be alternatively measured using, for example, a linewidth measuring functionality built in the exposure apparatus itself or a non-optical measuring apparatus such as an SEM. The focus monitor marks may be of any type that is measurable by using the optical linewidth measuring apparatus. For example, the each individual mark need not have a wedge shape with a sharp tip. As long as the mark has a shape with a tip portion formed narrower than the central portion of the mark, the mark exhibits sufficient functionality as a focus monitor mark.

The size and pitch of the focus monitor pattern, the transmittance of the translucent portion, and the width and the pitch of the exposure monitor pattern are not limited only to those of the present embodiment. These factors may be variously modified depending on the exposure conditions employed, thereby enabling the focus detection performance to be even more enhanced.

The focus monitor mark is not limited to that of the tapered pattern, but a mark of a pattern as shown in FIGS. 12A, 12B, and 12C may be used. FIGS. 12A, 12B, and 12C show the structure of the mask; and more specifically, FIG. 12A is a plan view showing the entirety of the mask, FIG. 12B is a plan view showing the structure of the focus monitor pattern, and FIG. 12C is a plan view showing the structure of the device region 102. As shown in FIGS. 12A, 12B, and 12C, a focus monitor pattern 500 is formed in a mask 400. The portion of focus monitor marks is constituted of a first pattern region 510 and a second pattern region 520. Openings 511 surrounded by a light shield film 203 is formed in the first pattern region 510. Openings 521 surrounded by a translucent film 202 is formed in the second pattern region 520. Openings 103 surrounded by the light shield film 203 are formed in a device region 102. A pattern of the device region 102 is an element separation pattern.

In this case, the dimensions of the openings 511 and the openings 521 are not measured, but the dimensions of the openings 521 and the openings 103 are each measured. From the dimensional difference between the two openings 103 and 521, the defocus amount can be obtained. Meanwhile, the device pattern to be used is not limited to the illustrated element separation pattern, but may be any one of various other patterns.

Different from the focus monitor pattern described earlier, the arrangement may be such that translucent films are provided in both the first and second pattern regions though rhombic marks being formed so as to produce phase differences therein.

Figure 13A:
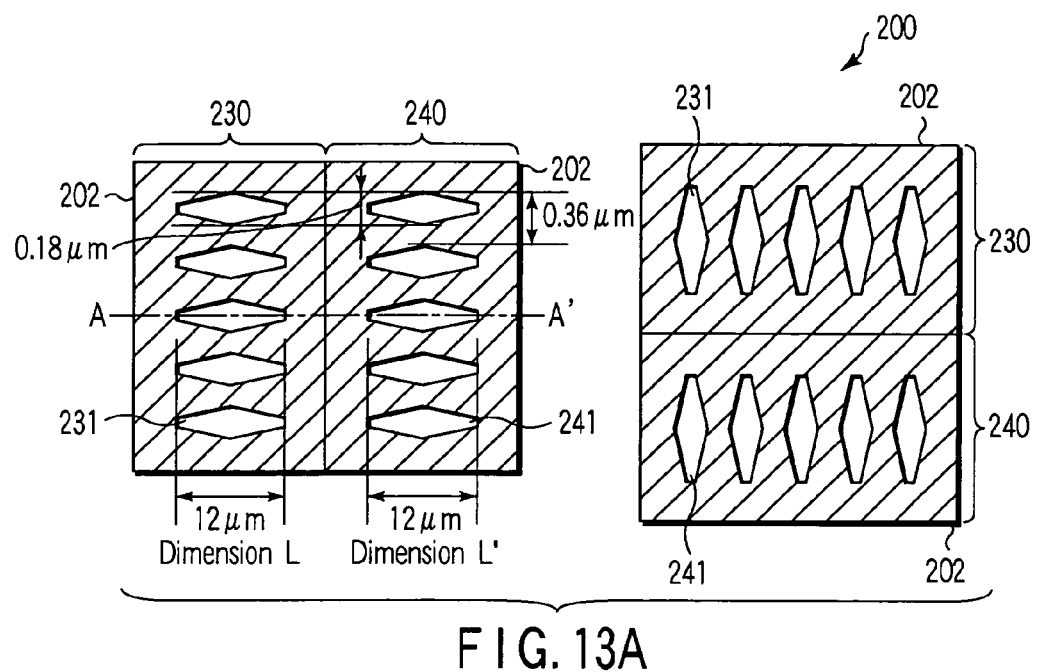
FIG. 13A is a plan view showing a focus monitor.
Figure 13B:
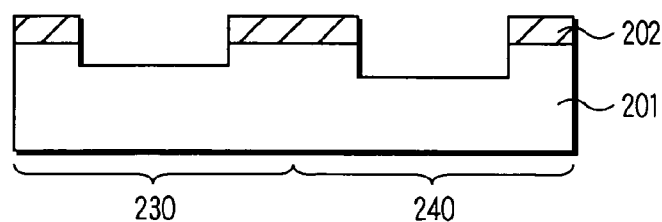
FIG. 13B is a cross sectional view along with the line A-A' showing FIG. 13A.

For example, as shown in FIG. 13, in a first pattern region 230 where rhombic marks 231 (first opening portion) are formed, a substrate 201 exposed to the opening portion is partly concavely formed (to a depth of 124 nm, for example). Thereby, light passing through a translucent film 202 in a peripheral portion of the rhombic marks 231 has a phase difference of +90 degrees with respect to light passing through the rhombic marks 231 provided as the opening portion. In a second pattern region 240 where rhombic marks 241 (second opening portion) are formed, the substrate 201 exposed to the opening portion is partly concavely formed (to a depth of 372 nm, for example). Thereby, light passing through the translucent film 202 in a peripheral portion of rhombic marks 241 has a phase difference of −90 degrees with respect to light passing through the rhombic marks 241 provided as the opening portion.

In the embodiments, the first pattern region and the second pattern region share the same translucent film, and different phase differences are imparted to the first pattern region and the second pattern region by concavely forming the transparent substrate in the opening portions. However, different translucent films may instead be used in the first and second pattern regions.

Moreover, the relationship between the light shield film or the translucent film portion and the opening portion in the first pattern region 210, 230 may be reversed. More specifically, the structure may be arranged to have a monitor pattern formed of a light-shielding film having a rhombic or wedge-shaped light shield film surrounded by an opening portion. Similarly, the relationship between the translucent film portion and the opening portion light shield film or the translucent film portion and the opening portion in the second pattern region 220, 240 may be reversed. That is, the structure may be arranged to have a monitor pattern formed of a light-shielding film having a rhombic or wedge-shaped light shield film surrounded by an opening portion. Even with any one of these combined structures being used, effects equivalent to those in the embodiment described above can be secured.

The present embodiment uses the marks of the translucent film having the 90-degree phase difference. However, the phase difference is not limited to 90 degrees, and any one of different phase differences may be selected for use as long as the selected phase difference causes best-focus positional variations between the wedge-shaped marks in the light shield film portion and the wedge-shaped marks in the translucent film portion.

In the present embodiment, while the calibration curve of the phase-difference focus monitor is assumed to be the primary straight line, it is not limited to thereto. As long as the characteristics of the calibration curve can be exhibited, various other functions may be used.

While the embodiment described above uses the mask, in which the exposure monitor pattern is formed, to determine the necessity/unnecessity of correcting the calibration curve, the embodiment may instead use a mask without the exposure monitor pattern at the time of making the determination.

In the present embodiment, while the marks are disposed on the dicing line of the device mask, as described above, the position is not limited to the dicing line. The focus can be monitored even when, for example, phase-difference focus monitor marks and exposure monitor marks are disposed in predetermined positions and are used, and a test mask including these marks is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A focus monitor method comprising:

preparing a mask comprising a first and second focus monitor patterns and an exposure monitor pattern, the first and second focus monitor patterns being used to form first and second focus monitor marks having dimensions variable depending on a defocus amount on a wafer, defocus amount dependency of the dimension of the first focus monitor mark being different from defocus amount dependency of the dimension of the second focus monitor mark, and the exposure monitor pattern being used to form exposure meters having dimensions variable depending on an effective exposure on the wafer;

obtaining exposure dependency of a relationship between the dimensions of the first and second focus monitor marks and the defocus amount;

forming the first and second focus monitor marks and the exposure meters on the wafer by using the mask;

measuring the dimensions of the exposure meters to obtain the effective exposure;

selecting a relationship, corresponding to the effective exposure, between the dimensions of the first and second focus monitor marks and the defocus amount in accordance with the obtained effective exposure and the exposure dependency of the relationship between the dimensions of the first and second focus monitor marks and the defocus amount;

measuring the dimensions of the first and second focus monitor marks; and obtaining the defocus amount in accordance with the measured dimensions of the first and second focus monitor marks and the relationship, corresponding to the effective exposure, between the dimensions of the first and second focus monitor marks and the defocus amount.

2. The focus monitor method according to claim 1, wherein the first monitor pattern is constituted by a first opening surrounded by a shielding portion or constituted by the shielding portion surrounded by the first opening;

the second monitor pattern is constituted by a second opening surrounded by a translucent film or constituted by the translucent film surrounded by the second opening, and a phase difference is provided between an exposure light passing through said translucent film and an exposure light passing through said second opening; and the relationship between the dimensions of the first and second focus monitor marks and the defocus amount is a relationship between a difference or a ratio and the defocus amount, said difference and ratio concerning those between dimensions of the first and second monitor patterns.

3. The focus monitor method according to claim 2, wherein the first and second monitor patterns each have a shape wherein both end portions are tapered along one direction with respect to a central portion thereof.

4. The focus monitor method according to claim 2, wherein a difference L between the dimension of the first monitor pattern and the dimension of the second monitor pattern, a defocus amount F, and an exposure E are expressed by $$L = \sum_{n=0} a_n E_n * F + \sum_{n=0} a'_n = 0^{E^n},$$

where "a" represents a coefficient and "n" represents an integer.

5. The focus monitor method according to claim 1, wherein
the first monitor pattern is constituted by a first translucent film surrounded by a first opening or constituted by the first opening surrounded by the first translucent film, and a first phase difference is provided between an exposure light passing through said first translucent film and an exposure light passing through said first opening,
the second monitor pattern is constituted by a second translucent film surrounded by a second opening or constituted by the second opening surrounded by the second translucent film, and a second phase difference different from the first phase difference is provided between an exposure light passing through the second translucent film and an exposure light passing through said second opening, and
the relationship between the dimensions of the first and second focus monitor marks and the defocus amount is a relationship between a difference or a ratio and the defocus amount, said difference and ratio concerning those between dimensions of the first and second monitor patterns.

6. The focus monitor method according to claim 5, wherein the first and second monitor patterns each have a shape wherein both end portions are tapered along one direction with respect to a central portion thereof.

7. The focus monitor method according to claim 1, wherein the exposure monitor pattern includes a plurality of blocks intermittently or continuously arranged in one direction, each of said plurality of blocks including a shield portion and a translucent portion arranged in said one direction within a constant width p where resolution by a projection exposure apparatus is impossible, the projection exposure apparatus being used for transcribing the exposure monitor pattern on a substrate, the shield portion and the translucent portion monotonously changing in dimension ratio in said one direction.

8. The focus monitor method according to claim 7, wherein,
a pitch P into which the width p is converted by a dimension on the substrate is expressed by $$1/P \geq (1+\sigma)NA/\lambda,$$

where "$\lambda$" represents wavelength of a light source of the projection exposure apparatus, "NA" represents the number of openings on the side of the substrate of an optical system, and "$\sigma$" represents a coherent factor; and
dimensional measurement of the exposure meters is measurement of a length of the blocks in an array direction.

9. The focus monitor method according to claim 5, wherein a difference L between the dimension of the first monitor pattern and the dimension of the second monitor pattern, a defocus amount F, and an exposure E are expressed by $$L = \sum_{n=0} a_n E_n * F + \sum_{n=0} a'_n = 0^{E^n}$$

where, "a" represents a coefficient and "n" represents an integer.

10. A focus monitor method comprising:
preparing a first mask comprising a first and second focus monitor patterns, the first and second focus monitor patterns being used to form first and second focus monitor marks having dimensions variable depending on a defocus amount on a wafer, defocus amount dependency of the dimension of the first focus monitor mark being different from defocus amount dependency of the dimension of the second focus monitor mark;
forming the first and second focus monitor marks on the wafer with a plurality of exposures;
obtaining a first relationship between the dimensions of the first and second focus monitor marks and the defocus amount for each of a plurality of exposures;
obtaining a nonuniformity amount of the first relationships due to a variation in the exposure;
obtaining a second relationship between the first relationship and the exposure when the obtained nonuniformity amount is greater than a predetermined value;
preparing a second mask comprising third and fourth focus monitor patterns and an exposure monitor pattern, the third and fourth focus monitor patterns being used to form third and fourth focus monitor marks having dimensions variable depending on the defocus amount on the wafer, defocus amount dependency of the dimension of the third focus monitor mark being different from that of the fourth focus monitor mark, and the exposure monitor pattern being used to form exposure meters having dimensions variable depending on an effective exposure on the wafer;
obtaining a third relationship between the dimensions of the exposure meters and the exposure;
forming the third and fourth focus monitor marks and the exposure meters on the wafer by using the second mask;
measuring the dimensions of the exposure meters;
obtaining the effective exposure from the measured dimensions of the exposure meters and the third relationship;
selecting a fourth relationship, corresponding to the effective exposure, between the dimensions of the third and fourth focus monitor marks and the defocus amount in accordance with the obtained effective exposure and the second relationship;
measuring the dimensions of the third and fourth focus monitor marks; and
obtaining the defocus amount in accordance with the measured dimensions of the third and fourth focus monitor marks and the fourth relationship.

11. The focus monitor method according to claim 10, wherein:
the first and second monitor patterns are constituted by a first opening surrounded by a shielding portion or constituted by the shielding portion surrounded by the first opening,
the third and fourth monitor patterns are constituted by a second opening surrounded by a translucent film or constituted by the translucent film surrounded by the second opening, and a phase difference is provided between an exposure light passing through said translucent film and an exposure light passing through said second opening, the relationship between the dimensions of the first and second focus monitor marks and the defocus amount is a relationship between a difference or a ratio and the defocus amount, said difference and ratio concerning those between dimensions of the first and second monitor patterns, and the relationship between the dimensions of the third and fourth focus monitor marks and the defocus amount is a relationship between a difference or a ratio and the defocus amount, said difference and ratio concerning those between dimensions of the third and fourth monitor patterns.

12. The focus monitor method according to claim 11, wherein the first and second monitor patterns each have a shape wherein both end portions are tapered along one direction with respect to a central portion thereof.

13. The focus monitor method according to claim 11, wherein a difference L between the dimension of the first monitor pattern in a first patter region and the dimension of the second monitor pattern in a second patter region, a defocus amount F, and an exposure E are expressed by $$L = \sum_{n=0} a_n E_n * F + \sum_{n=0} a'_n = 0^{E^n}$$

where, "a" represents a coefficient and "n" represents an integer.

14. The focus monitor method according to claim 10, wherein the first and third monitor patterns are constituted by a first translucent film surrounded by a first opening or constituted by the first opening surrounded by the first translucent film, and a first phase difference is provided between an exposure light passing through said first translucent film and an exposure light passing through said first opening, the second and fourth monitor patterns are each constituted by a second translucent film surrounded by a second opening or constituted by the second opening surrounded by the second translucent film, and a second phase difference different from the first phase difference is provided between an exposure light passing through the second translucent film and an exposure light passing through said second opening, the relationship between the dimensions of the first and second focus monitor marks and the defocus amount is a relationship between a difference or a ratio and the defocus amount, said difference and ratio concerning those between dimensions of the first and second monitor patterns, and the relationship between the dimensions of the third and fourth focus monitor marks and the defocus amount is a relationship between a difference or a ratio and the defocus amount, said difference and ratio concerning those between dimensions of the third and fourth monitor patterns.

15. The focus monitor method according to claim 14, wherein the first, second, third, and fourth monitor patterns each have a shape wherein both end portions are tapered along one direction with respect to a central portion thereof.

16. The focus monitor method according to claim 10, wherein the exposure monitor pattern includes a plurality of blocks intermittently or continuously arranged in one direction, each of said plurality of blocks including a shield portion and a translucent portion arranged in said one direction within a constant width p where resolution by a projection exposure apparatus is impossible, the projection exposure apparatus being used for transcribing the exposure monitor pattern on a substrate, the shield portion and the translucent portion monotonously changing in dimension ratio in said one direction.

17. The focus monitor method according to claim 16, wherein, a pitch P into which the width p is converted by a dimension on the substrate is expressed by $$1/P \geq (1+\sigma)NA/\lambda,$$

where "λ" represents wavelength of a light source of the projection exposure apparatus, "NA" represents the number of openings on the side of the substrate of an optical system, and "σ" represents a coherent factor; and dimensional measurement of the exposure meters is measurement of a length of the blocks in an array direction.

18. The focus monitor method according to claim 14, wherein a difference L between the dimension of the first monitor pattern and the dimension of the second monitor pattern, a defocus amount F, and an exposure E are expressed by $$L = \sum_{n=0} a_n E_n * F + \sum_{n=0} a'_n = 0^{E^n}$$

where, "σ" represents a coefficient and "n" represents an integer.

19. A mask comprising:

a device region wherein a device pattern is formed;

a first pattern region having at least one first monitor pattern which is constituted by a first opening surrounded by a shielding portion or constituted by the shielding portion surrounded by the first opening;

a second pattern region having at least one second monitor pattern which is constituted by a second opening surrounded by a translucent film or constituted by the translucent film surrounded by the second opening, and a phase difference being provided between an exposure light passing through said translucent film and an exposure light passing through said second opening; and a third pattern region including a plurality of blocks intermittently or continuously arranged in one direction, each of said plurality of blocks including a shield portion and a translucent portion arranged in said one direction within a constant width p, the shield portion and the translucent portion monotonously changing in dimension ratio in said one direction, wherein one of the first pattern region and the second pattern region is formed at least in the device region.

20. The mask according to claim 19, wherein the first and second monitor patterns each have a shape wherein both end portions are tapered along one direction with respect to a central portion thereof.

21. A mask comprising:

a device region wherein a device pattern is formed;

a first pattern region comprising at least one first monitor pattern which is constituted by a first translucent film surrounded by a first opening or constituted by the first opening surrounded by the first translucent film, and a first phase difference being provided between an exposure light passing through said first translucent film and an exposure light passing through said first opening;

a second pattern region comprising at least one second monitor pattern which constituted by a second translucent film surrounded by a second opening or constituted by the second opening surrounded by the second translucent film, and a second phase difference different from the first phase difference being provided between an exposure light passing through the second translucent film and an exposure light passing through said second opening; and a third pattern region including a plurality of blocks intermittently or continuously arranged in one direction, each of said plurality of blocks including a shield portion and a translucent portion arranged in said one direction within a constant width p, the shield portion and the translucent portion monotonously changing in dimension ratio in said one direction, wherein one of the first pattern region and the second pattern region is formed at least in the device region.

22. The mask according to claim 21, wherein the first and second monitor patterns each have a shape wherein both end portions are tapered along one direction with respect to a central portion thereof.

23. A method for manufacturing a semiconductor device, comprising:

preparing the mask as defined in claim 19; and transferring to a semiconductor substrate the device pattern formed in the mask.

24. A method for manufacturing a semiconductor device, comprising:

preparing the mask as defined in claim 21; and transferring to a semiconductor substrate the device pattern formed in the mask.

* * * * *

UNITED STATES PATENT AND TRADEMARK OFFICE
CERTIFICATE OF CORRECTION

PATENT NO. : 7,250,235 B2  Page 1 of 1
APPLICATION NO. : 10/784277
DATED : July 31, 2007
INVENTOR(S) : Izuha et al.

It is certified that error appears in the above-identified patent and that said Letters Patent is hereby corrected as shown below:

Title page, item (57), line 6, change "a exposure" to --an exposure--.

Claim 13, column 13, line 23, change "patter" to --pattern--.

Claim 13, column 13, line 24, change "patter" to --pattern--.

Signed and Sealed this

Thirtieth Day of October, 2007

JON W. DUDAS
*Director of the United States Patent and Trademark Office*